United States Patent
Ogiso

(10) Patent No.: US 7,230,501 B2
(45) Date of Patent: Jun. 12, 2007

(54) OSCILLATION CIRCUIT AND ELECTRONIC EQUIPMENT

(75) Inventor: Hiroyuki Ogiso, Ina (JP)

(73) Assignee: Seiko Epson Corporation (JP)

( * ) Notice: Subject to any disclaimer, the term of this patent is extended or adjusted under 35 U.S.C. 154(b) by 107 days.

(21) Appl. No.: 11/096,262

(22) Filed: Mar. 31, 2005

(65) Prior Publication Data

US 2005/0270111 A1   Dec. 8, 2005

(30) Foreign Application Priority Data

Apr. 6, 2004   (JP)   ............... 2004-112296

(51) Int. Cl.
*H03B 5/30*   (2006.01)
(52) U.S. Cl. ............... 331/107 A; 331/116 R; 331/116 M; 331/154; 331/179; 331/96; 333/193; 333/195
(58) Field of Classification Search ........... 331/116 R, 331/107 A, 116 M, 154, 179, 96; 333/195, 333/193
See application file for complete search history.

(56) References Cited

U.S. PATENT DOCUMENTS

| | | | |
|---|---|---|---|
| 4,233,573 A * | 11/1980 | Grudkowski | ............ 331/107 A |
| 5,016,260 A | 5/1991 | Masuda | |
| 5,874,866 A * | 2/1999 | Satoh et al. | ............ 331/107 A |
| 6,559,736 B2 * | 5/2003 | Lu et al. | ...................... 333/152 |
| 7,005,947 B2 * | 2/2006 | Iwashita et al. | ............ 333/193 |

FOREIGN PATENT DOCUMENTS

| | | |
|---|---|---|
| JP | 02-124659 | 5/1990 |
| JP | 03-222511 | 10/1991 |
| JP | 06-310978 | 11/1994 |
| JP | 2925158 | 5/1995 |
| JP | 08-213838 | 8/1996 |
| JP | 2004-040421 | 2/2005 |

OTHER PUBLICATIONS

International Search Report issued in the related PCT application No. PCT/JP2005/007185.

* cited by examiner

*Primary Examiner*—Robert Pascal
*Assistant Examiner*—Levi Gannon
(74) *Attorney, Agent, or Firm*—Harness, Dickey & Pierce, P.L.C.

(57) ABSTRACT

An oscillation circuit comprises a SAW resonator having a pair of reflectors disposed on a piezoelectric substrate and a pair of IDTs which are set up in parallel between the pair of reflectors and which are constituted by teeth-of-a-comb electrodes; an inverter to which the pair of IDTs are connected in parallel; and a change-over unit which is provided between each of a pair of the teeth-of-a-comb electrodes constituting either of the IDTs of the pair of IDTs and the inverter and which changes over and connects an input side and an output side of the inverter connected to each of the pair of the teeth-of-a-comb electrodes.

4 Claims, 4 Drawing Sheets

OSCILLATION CIRCUIT AND ELECTRONIC EQUIPMENT

BACKGROUND

1. Technical Field

The present invention relates to an oscillation circuit and electronic equipment with the oscillation circuit built therein, and particularly to an oscillation circuit suited to equipment performing communications through Frequency Shift Keying (FSK) and electronic equipment with the oscillation circuit built therein.

2. Description of the Related Art

As a method of communicating in digital signals, a communications method through FSK has hitherto been known. FSK is, for example, a modulation method of discretely changing an instantaneous frequency of a carrier wave corresponding to digital signals of 0 and 1. This makes it possible to apply modulation while keeping an amplitude change at a constant level, subject to very little effects due to level fluctuation and noise. Further, there are characteristics of simple circuit configuration and a wider band width than Amplitude Shift Keying (ASK) and Phase Shift Keying (PSK).

As mentioned above, the communications method through FSK has a high utilization value, and oscillation circuits and oscillators using this type of communications method have been variously proposed. For example, the oscillation circuits and the oscillators proposed in Japanese Patent No. 2925158 and Japanese Published Unexamined Patent No. 2004-40421 make use of the communications method of FSK.

The oscillator described in Japanese Patent No. 2925158 is constituted such that a plurality of SAW resonators of different resonant frequencies are provided on a piezoelectric substrate, and that the same number of oscillation circuits as SAW resonators are provided on a semiconductor integrated circuit substrate, while the oscillation circuit is connected to a change-over circuit.

In the oscillator of such configuration, a change-over circuit is operated according to a band of a frequency in use, an oscillation circuit connected to a SAW resonator corresponding to a desired frequency band is selected, and oscillation is generated.

Further, the oscillation circuit described in Japanese Published Unexamined Patent No. 2004-40421 is provided in the circuit with SAW filters of two different types of frequency bands which are permitted to pass, with the change-over circuit on an output side of the SAW filters, thus constituting a feedback circuit equipped with an amplifier and a fixed phase shifter.

In such oscillation circuit, it is possible to select only a frequency of a desired frequency band by changing over a SAW filter connected by the change-over circuit.

According to the oscillators and the oscillation circuits described in the above-mentioned Japanese Patent No. 2925158 and Japanese Published Unexamined Patent No. 2004-40421, an oscillator and an oscillation circuit corresponding to a design frequency band can be provided.

However, the oscillators and the oscillation circuits described in the above-mentioned Japanese Patent No. 2925158 and Japanese Published Unexamined Patent No. 2004-40421 are constituted such that a plurality of SAW resonators or SAW filters of different resonant frequencies are respectively provided, which correspond to a required frequency band by changing over a frequency band in use. Consequently, when changing over SAW resonators or SAW filters, an oscillating frequency may be instantaneously cut off as a result of factors due to electrical connection, factors due to a phase shift difference in SAW resonators and SAW filters, and the like, thereby causing a discontinuity of output phase shifting and generating an error at the time of change-over. Such problems exert considerable effect upon high-speed communications. Further, in the oscillation circuit described in Japanese Patent No. 2925158, by providing a plurality of SAW resonators of different specifications within one circuit, there is a problem which makes it impossible to obtain frequency precision and deviation precision in respective SAW resonators.

It is an object of the present invention to provide an oscillation circuit and electronic equipment with the oscillation circuit built therein, which can solve the above-mentioned problems and, even in a case where the frequency band changes, eliminate discontinuity of output phase shifting accompanying the change-over of the frequency band, and properly maintain the frequency precision and the deviation precision as well.

To accomplish the above-mentioned object, with any of the SAW resonators changing over the frequency band as a reference, it is conceived proper if a phase shift at the time of change-over can be instantly made to correspond to a signal of the SAW resonator set as the above-mentioned reference. Also, to keep the frequency precision and the deviation precision properly, it is considered necessary to reduce mutual interference among the SAW resonators performing the change-over.

SUMMARY

Now, an oscillation circuit according to the present invention comprises: an SAW resonator, having a pair of reflectors disposed on an piezoelectric substrate, and a pair of IDTs made up of teeth-of-a-comb shaped electrodes which are set up in parallel between the pair of reflectors; an amplifier circuit in which the above-mentioned pair of IDTs are connected in parallel; and a change-over circuit which is provided between each of the pair of the above-mentioned teeth-of-a-comb shaped electrodes constituting either of the above-mentioned pair of the IDTs, and the above-mentioned amplifier circuit, and which changes over and connects an input side and an output side of the above-mentioned amplifier circuit connected respectively to the above-mentioned pair of the teeth-of-a-comb shaped electrodes.

According to the oscillation circuit of the foregoing configuration, by setting connection to an input/output signal to one IDT of the SAW resonators provided in the circuit as fixed and by making it possible to change over the connection of the input/output signal to the other IDT through the change-over circuit, it is made possible to realize a plurality of oscillation types, for example, SO mode and AO mode by one SAW resonator. As a result, it becomes possible to generate a plurality of oscillation of different frequency bands by means of one SAW resonator. To enable the change-over of the frequency band to be carried out by one SAW resonator, it is not necessary to tune frequency precision and frequency deviation precision. Consequently, adjusting the frequency precision and the frequency deviation precision is facilitated, making it possible to properly maintain both the frequency precision and the frequency deviation precision. Further, by generating constant oscillation at an oscillation part oscillating with either of the above-mentioned one pair of IDTs set as the reference, the oscillation part of the reference can be set up within one oscillator. Consequently, even if the change-over of the input/output signal with respect to the other IDT is carried out, the phase can be instantly made to match the oscillation of the above-mentioned one IDT, thereby eliminating discontinuity of the output phase. Further, with the SAW resonator provided in the circuit as one, the changeover of the frequency band is made possible by one SAW resonator, whereby size reduction and cost reduction of the oscillation circuit can be greatly improved.

Further, in the oscillation circuit of the foregoing configuration, the above-mentioned pair of IDTs may very well be constituted such that the widths of crossing of the above-mentioned teeth-of-a-comb shaped electrodes are identical.

Through the foregoing configuration, it is possible to synchronize mutual oscillation by the IDTs, while, at the same time, improving the frequency precision and the frequency deviation precision. This is caused by the IDTs in the SAW resonator which generate a slight change in the frequency to be outputted by changing the widths of crossing. Hence, by adjusting (controlling) the widths of crossing of the teeth-of-a-comb shaped electrodes which make up the IDTs, a desired frequency precision can be realized.

Further, it is adequate to provide electronic equipment for accomplishing the foregoing object with an improvement of a built-in oscillation circuit of the foregoing configuration.

DETAILED DESCRIPTION

An embodiment of the present invention pertaining to an oscillation circuit of the present invention and electronic equipment with the oscillation circuit built therein will be described below with reference to the drawings. It should be noted that the embodiment disclosed below is part of embodiments pertaining to the oscillation circuit and electronic equipment of the present invention, whereas the present invention incorporates a variety of embodiments insofar as its principal part is not altered.

Figure 1:
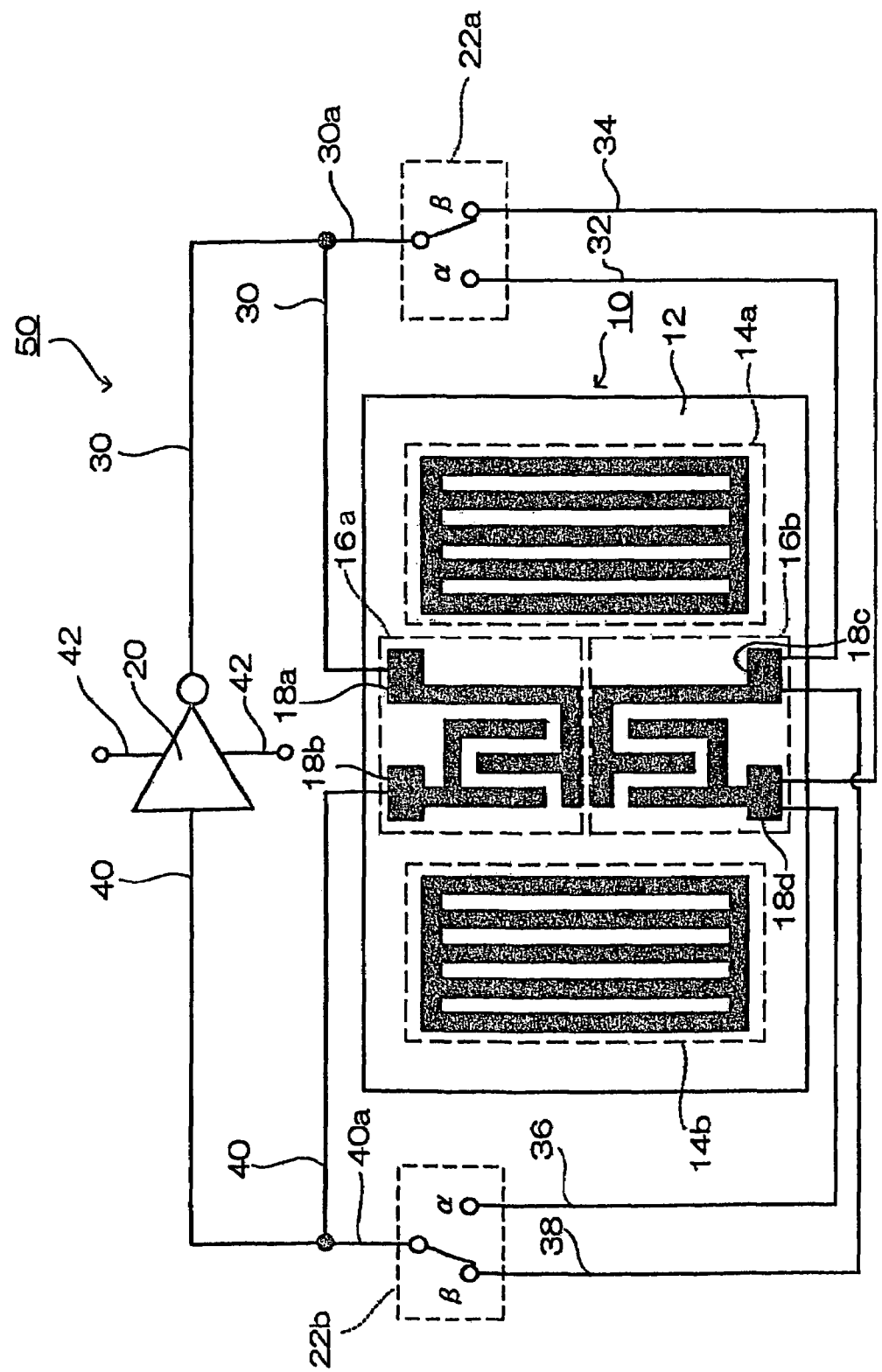
FIG. 1 is a block diagram showing an embodiment according to an oscillation circuit of the present invention.

First, schematic configuration of the oscillation circuit according to the present embodiment will be described with reference to FIG. 1. An oscillation circuit 50 according to the present embodiment is based on configuration of a SAW resonator 10, an inverting amplifier (hereinafter referred to as "inverter") 20 as an amplifier circuit to transfer signals to the SAW resonator 10, and a power source 42 connected to the inverter 20, the SAW resonator 10 and the inverter 20 constituting a feedback circuit.

Figure 2:
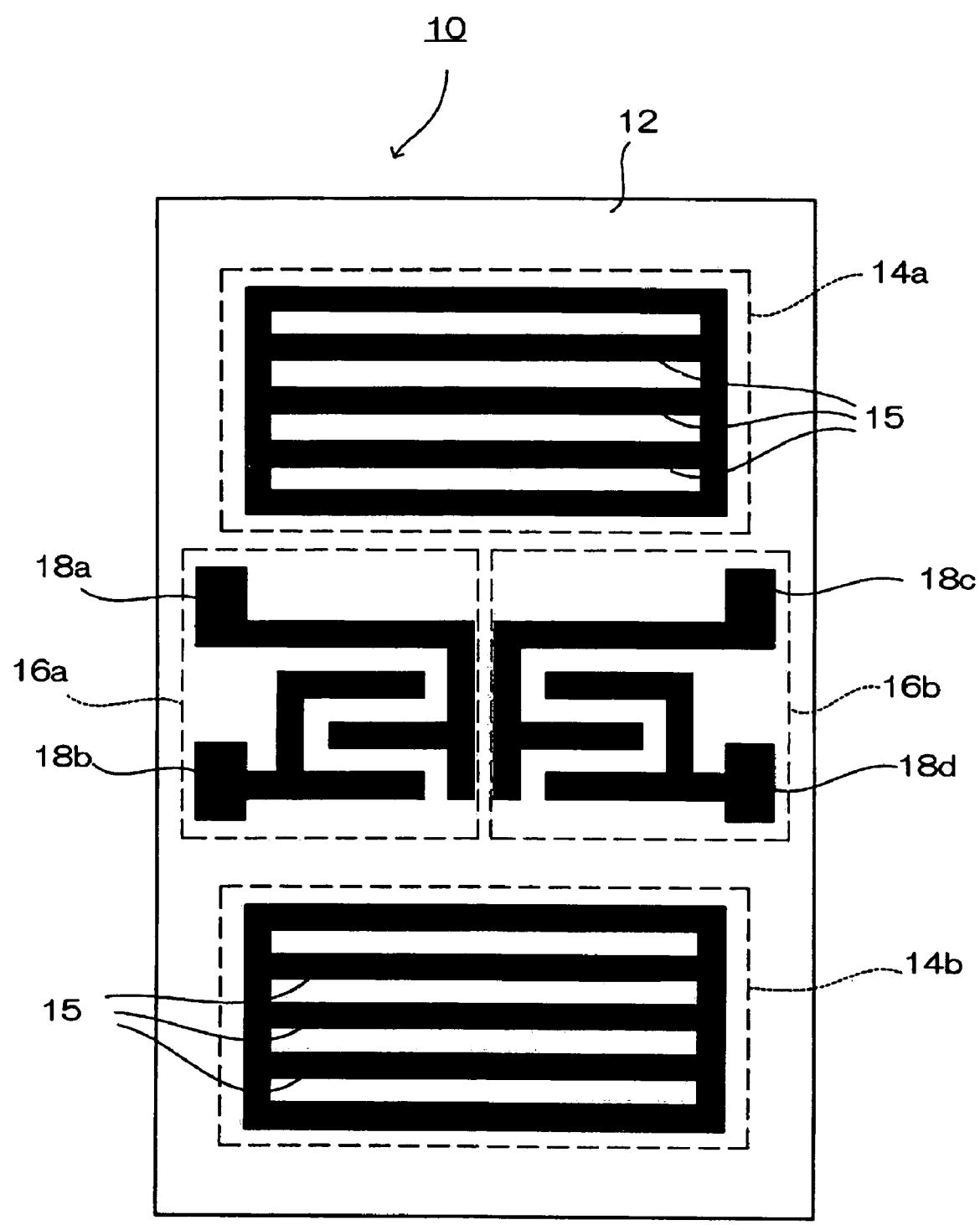
FIG. 2 is a block diagram showing configuration of an SAW resonator to be mounted on the oscillation circuit of the present invention.

As shown in FIG. 2, the SAW resonator 10 in the present embodiment includes a piezoelectric substrate 12, a pair of reflectors 14a and 14b disposed over one surface of the piezoelectric substrate 12, and a conductive pattern forming a plurality of teeth-of-a-comb shaped electrodes 18 (18a, 18b, 18c, and 18d) which are provided between the pair of reflectors 14 (14a and 14b).

The piezoelectric substrate 12 may be constituted by a single crystal having piezoelectric property, such as quartz, lithium tantalate (LiTaO$_3$), lithium tetraborate (Li$_2$B$_4$O$_7$), lithium niobate (LiNbO$_7$), a sapphire substrate provided with a ZnO thin film, and the like.

Further, the conductive pattern forming the reflectors 14 and the teeth-of-a-comb shaped electrodes 18 disposed on the piezoelectric substrate 12 may be that which is obtainable through formation of a thin film by subjecting a conductive metal such as gold, copper or aluminum to vapor deposition, sputtering, and the like and formation of a pattern by etching (for example, photolithography).

The reflectors 14 disposed on the piezoelectric substrate 12 of the SAW resonator 10 mounted on the oscillation circuit 50 of the present embodiment is of a pattern formed in a ladder shape and placed in a direction of propagation of elastic surface waves on the piezoelectric substrate 12 such that ladder shaped electrode parts 15 intersect at right angles. Further, the reflectors 14 are disposed on the piezoelectric substrate 12 in a pair. Disposition of the pair of the reflectors 14a and 14b is made along the direction of propagation of the elastic surface waves.

The teeth-of-a-comb shaped electrodes 18 form one interdigital transducer (IDT) by meshing two electrodes, one electrode serving on the input side of the signals and another electrode serving on the output side of the signals.

IDTs 16 are disposed on the piezoelectric substrate 12 in a pair between the reflectors 14a and 14b in parallel. To be specific, on the piezoelectric substrate 12, in the direction of disposition of the reflectors 14a and 14b, the pair of IDTs 16a and 16b are arranged between the reflectors 14a and 14b such as to be disposed in linear symmetry with the direction of propagation of the elastic surface waves as an axis. In disposing the IDTs 16, it is arranged such that an insulating part is provided between the pair of the IDTs 16a and 16b along the direction of propagation of the elastic surface waves. It should be noted that the teeth-of-a-comb shaped electrode parts in the teeth-of-a-comb shaped electrodes 18 are arranged such as to intersect at right angles in the direction of propagation of the elastic surface waves.

In the SAW resonator 10 of the forgoing configuration, by inverting signals to be inputted to and signals to be outputted from the teeth-of-a-comb shaped electrodes 18a–18c which constitute the IDTs 16a and 16b, it is possible to realize oscillation in different modes (S0 mode and A0 mode in the present embodiment). Consequently, it becomes possible to generate oscillation of a plurality of frequency bands by means of one SAW resonator 10. Further, inasmuch as change-over of frequency bands is possible by one SAW resonator, there would be no need to oscillate by tuning the frequency precision and the frequency deviation precision of the plurality of SAW resonators. Therefore, adjusting the frequency precision or the frequency deviation precision is facilitated, making it possible to properly maintain both the frequency precision and the frequency deviation precision.

Further, by letting either IDT 16 of the pair of the IDTs 16 (16a and 16b) oscillate at all times as an oscillation part generating oscillation as the reference, a reference oscillation part is provided inside one SAW resonator 10. Hence, even if change-over of the input/output signal of the other IDT 16 is carried out, the phase can be instantly matched to the other IDT 16 serving as the reference oscillation part, generating no discontinuity of the output phase.

Figure 3:
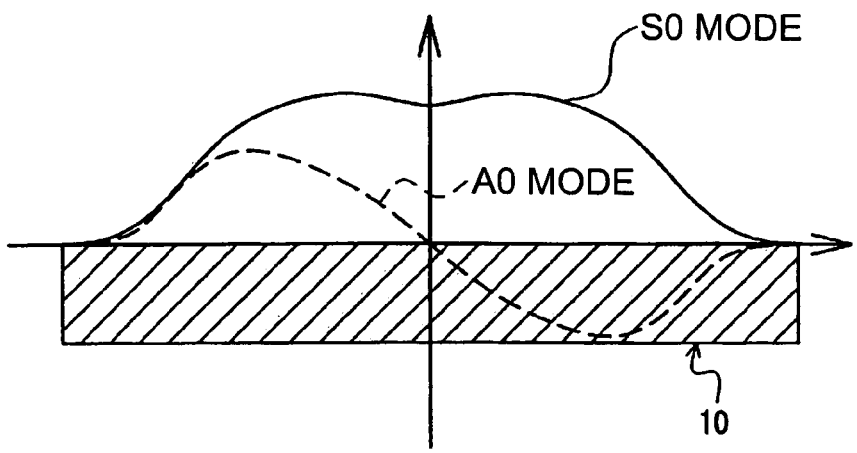
FIG. 3 is a diagram showing oscillation mode in the SAW resonator to be mounted on the oscillation circuit of the present invention.

In the present embodiment, the S0 mode and the A0 mode refer to oscillation forms shown in FIG. 3. Namely, the S0 mode is a linear symmetry mode considered a basic mode, while the A0 mode is a point symmetry mode considered to be a high order mode.

Configuration of an oscillation circuit on which an SAW resonator of the foregoing configuration is mounted is as follows (refer to FIG. 1).

Namely, it is configured such that the IDT 16a and the IDT 16b constituting the SAW resonator 10 are connected in parallel to the inverter 20, with a change-over circuit (change-over means) 22 being provided between the IDT 16b and the inverter 20 to enable the input/output signals to the teeth-of-a-comb shaped electrodes 18 to be inverted.

To be specific, the configuration is as follows. If the teeth-of-a-comb shaped electrode 18a of the IDT 16a is set as an input electrode and the teeth-of-a-comb shaped electrode 18b is set as an output electrode, an input signal route 30 for inputting an input signal to the IDT 16a, which is an output signal from the inverter 20, is connected to the teeth-of-a-comb shaped electrode 18a, while an output signal route 40 for outputting an output signal from the IDT 16a, which is an input signal to the inverter 20, is connected to the teeth-of-a-comb shaped electrode 18b.

Further, the input signal route 30 and the output signal route 40 are branched to an input signal route 30a and an output signal route 40a. In the input/output signal routes 30a and 40a, there is provided change-over means 22 (22a and 22b) which makes it possible to change-over α and β that select an either route of two systems of an S0 mode signal transfer route and an A0 mode signal transfer route.

The S0 mode signal transfer route and the A0 mode signal transfer route which enable changing over by the change-over means 22 are respectively connected to the IDT 16b. In the IDT 16b, it is configured so that the signal routes on the output side and the input side are respectively connected to both the teeth-of-a-comb shaped electrode 18c and the teeth-of-a-comb shaped electrode 18d. Namely, when an input side S0 mode signal transfer route (input signal route) 32 at the time of selecting α is connected to the teeth-of-a-comb shaped electrode 18c, an output side S0 mode signal transfer route (output signal route) 36 at the time of selecting α is connected to the teeth-of-a-comb shaped electrode 18d. In this case, an input side A0 mode signal transfer route (input signal route) 34 at the time of selecting β is connected to the teeth-of-a-comb shaped electrode 18d, and an output side A0 mode signal transfer route (output signal route) 38 at the time of selecting β is connected to the teeth-of-a-comb shaped electrode 18c.

By employing such circuit configuration, it becomes possible to invert the input/output of signals with respect to the IDT 16b by changing over α and β through the change-over means 22. It should be noted that the change-over means 22a and 22b perform the change-over of α and β synchronously.

In the oscillation circuit configured as described above, the IDT 16a to which the input/output signal routes 30 and 40 are connected has no change in the phase of the elastic surface waves because no change-over is performed between the teeth-of-a-comb shaped electrode 18a to which signals are inputted and the teeth-of-a-comb shaped electrode 18c from which signals are outputted.

On the other hand, in the IDT 16b to which the input/output signal routes 30a and 40a are connected, the teeth-of-a-comb shaped electrode on the input side and the teeth-of-a-comb shaped electrode on the output side are inverted as the α and β of the input/output routes are changed over by controlling the change-over means 22, so that the phase of the oscillating elastic surface waves slips off by 90°.

As a result, if the change-over means 22a is set at α, the teeth-of-a-comb shaped electrode 18a and the teeth-of-a-comb shaped electrode 18c become the electrodes on the signal input side to put the elastic surface waves oscillated by the IDT 16a and the IDT 16b on the same phase, generating oscillation in S0 mode as the oscillation circuit. On the other hand, if the change-over means 22a is set at β, the teeth-of-a-comb shaped electrode 18a and the teeth-of-a-comb shaped electrode 18d become the electrodes on the signal input side to put the elastic surface waves oscillated by the IDT 16a and the IDT 16b on the inverted phase, generating oscillation in A0 mode as the oscillation circuit.

In this manner, the SAW resonator of the foregoing configuration is able to realize oscillation in two modes with one SAW resonator by controlling the input/output of signals to each of the teeth-of-a-comb shaped electrodes 18a–18d.

Further, in the oscillation circuit 50 of the foregoing configuration, since it is configured such that the input/output of signals to and from the teeth-of-a-comb shaped electrodes 18a and 18b which constitute the IDT 16a is continuously carried out, even when inverting (changing over) signals inputting/outputting to and from the IDT 16b, there is no possibility of oscillation as the SAW resonator or the oscillation circuit being cut off instantaneously with no slippage of the output phase shifting caused therefrom. Accordingly, this enables it to be used for high-speed communications and the like.

Figure 4:
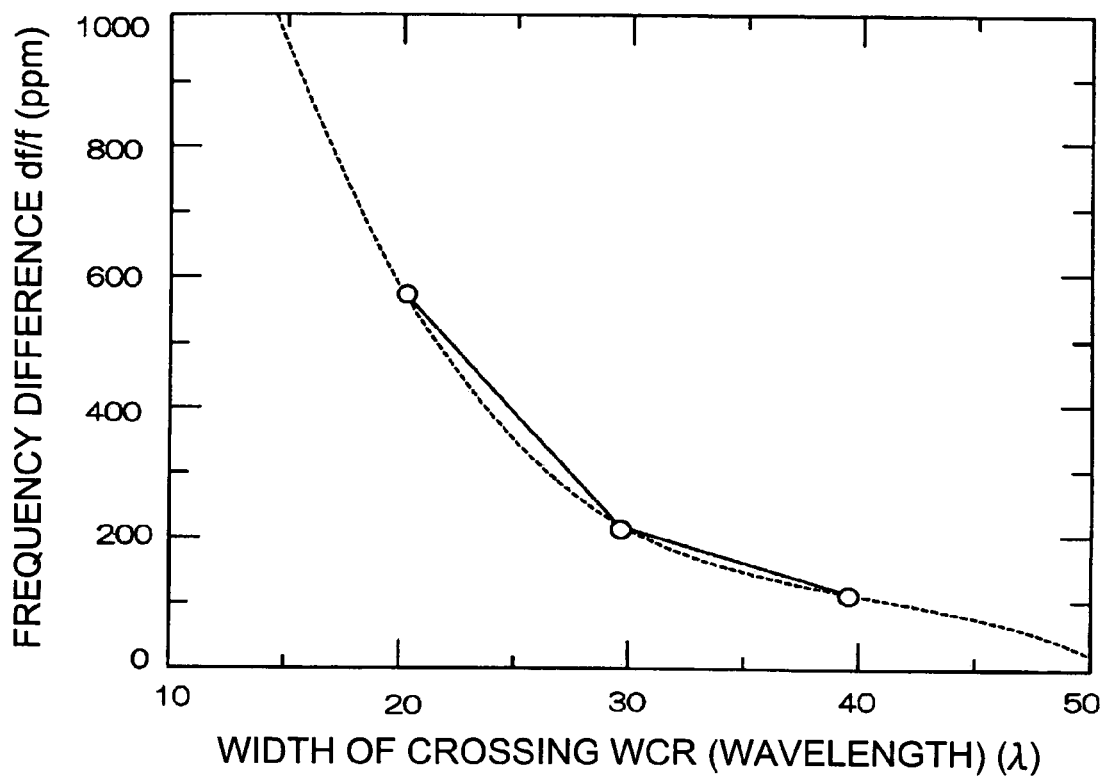
FIG. 4 is a chart showing changes of a frequency difference when a width of crossing of a teeth-of-a-comb shaped electrode of the SAW resonator to be mounted on the oscillation circuit of the present invention is changed.

Generally, it is known that changing the widths of crossing of a pair of the teeth-of-a-comb shaped electrodes constituting the SAW resonator causes a change in the oscillation frequency. Hence, in the SAW resonator 10 to be mounted on the oscillation circuit 50 of the foregoing configuration, there is an arrangement such that the crossing width of each teeth-of-a-comb shaped electrode 18 constituting the IDT 16 can be adjusted (controlled) according to a desired frequency. This enables a frequency difference (frequency deviation) to be adjusted as shown in FIG. 4. According to FIG. 4, it is apparent that by setting the crossing width, the frequency difference can be adjusted to a value of practical level. It should be noted that the crossing widths of the teeth-of-a-comb shaped electrodes 18 between the IDT 16a and the IDT 16b are configured such as to be identical. This enables oscillation by mutual IDTs to be tuned, thus making oscillation in S0 mode and in A0 mode possible.

In the oscillation circuit 50 of the foregoing configuration, when connecting a signal transfer route to the SAW resonator 10, the input/output signal routes 30 and 40 are connected to the IDT 16a, and the input/output signal routes 30a and 40a are connected to the IDT 16b. Naturally, a configuration in which the input/output signal routes 30 and 40 are connected to the IDT 16b, while the input/output signal routes 30a and 40a are connected to the IDT 16a, is acceptable as well.

Figure 5:
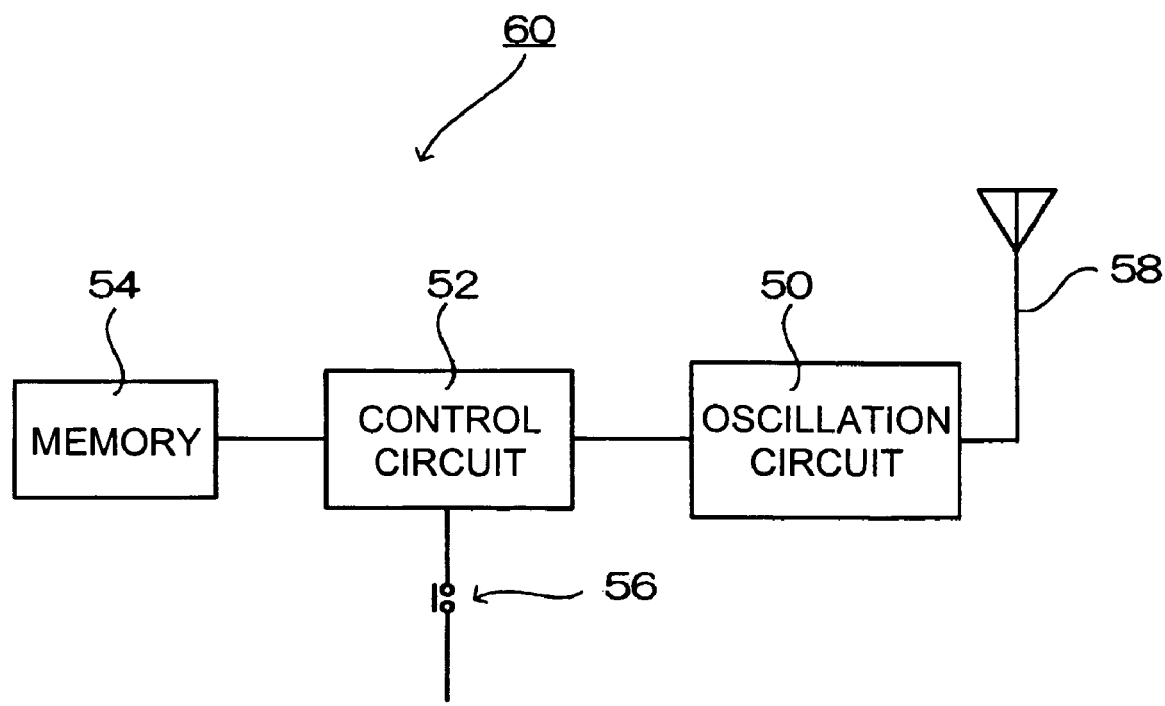
FIG. 5 is a block diagram showing configuration of electronic equipment with the oscillation circuit according to the present invention built therein.

The oscillation circuit 50 of the foregoing configuration can be built in a variety of electronic equipment and used. For example, it can be built in an FSK oscillator (transmitter) 60 shown in FIG. 5. It comprises a memory 54 recording FSK data, an oscillation circuit 60 generating oscillation based on FSK data in the memory 54, a control circuit 52 for transmitting the FSK data in the memory 54 to the oscillation circuit 50 as necessary, a switch 56 for activating the oscillation circuit, and an antenna 58 for oscillating signals to the outside.

According to the FSK oscillator 60 of the foregoing configuration, since the SAW resonator to mounted in the oscillation circuit 50 can be set as one, it is possible to make the equipment smaller at lower cost. The FSK oscillator 60 of such configuration can be used, for example, as a keyless oscillator of a car which makes keyless entry possible.

What is claimed is:

1. An oscillation circuit comprising:
    a SAW resonator having a pair of reflectors disposed on a piezoelectric substrate and a pair of IDTs in parallel between the pair of reflectors and constituted by teeth-of-a-comb electrodes;
    an amplifier circuit connected in parallel to said pair of IDTs;
    said pair of IDTs comprising a first IDT and a second IDT; and
    a change-over circuit provided between each of a pair of said teeth-of-a-comb electrodes constituting said second IDT and said amplifier circuit and which changes over and connects an input side and an output side of said amplifier circuit connected to each of said pair of the teeth-of-a-comb electrodes constituting said second IDT.

2. The oscillation circuit according to claim 1, wherein said pair of IDTs are configured such that crossing widths of the teeth-of-a-comb electrodes are identical.

3. Electronic equipment having the oscillation circuit according to claim 1.

4. An oscillation circuit comprising:
    a SAW resonator including:
        a pair of reflectors disposed on a piezoelectric substrate; and
        a first IDT and a second IDT disposed in parallel between the pair of reflectors, said first and second IDTs each comprising teeth-of-a-comb electrodes;
    an amplifier circuit connected in parallel to said first and second of IDTs; and
    a change-over circuit between each of a pair of said teeth-of-a-comb electrodes constituting said second IDT and said amplifier circuit, the change-over circuit changing over and connecting an input side and an output side of said amplifier circuit connected to each of said pair of the teeth-of-a-comb electrodes constituting said second IDT.

* * * * *